United States Patent [19]
Kurihara

[11] Patent Number: 5,731,214
[45] Date of Patent: Mar. 24, 1998

[54] MANUFACTURE OF SEMICONDUCTOR DEVICE WITH SELF-ALIGNED DOPING

[75] Inventor: Shunsuke Kurihara, Hamamatsu, Japan

[73] Assignee: Yamaha Corporation, Japan

[21] Appl. No.: 808,241

[22] Filed: Feb. 28, 1997

[30] Foreign Application Priority Data

Mar. 2, 1996 [JP] Japan .................. 8-071482

[51] Int. Cl.6 .................. H01L 21/265; H01L 21/469
[52] U.S. Cl. .................. 437/34; 437/57; 437/231
[58] Field of Search .................. 437/34, 56, 57, 437/231

[56] References Cited

U.S. PATENT DOCUMENTS

| | | | |
|---|---|---|---|
| 4,558,508 | 12/1985 | Kinney et al. | 437/56 |
| 4,578,859 | 4/1986 | Hause et al. | 29/578 |
| 4,600,445 | 7/1986 | Horr et al. | 437/57 |
| 4,764,477 | 8/1988 | Chang et al. | 437/29 |
| 4,767,721 | 8/1988 | Liao et al. | 437/34 |
| 4,956,306 | 9/1990 | Fuller et al. | 437/34 |

FOREIGN PATENT DOCUMENTS 4-343264  11/1992  Japan .

*Primary Examiner*—Brian Dutton

[57] ABSTRACT

Ion doped source and drain regions $S_{11}$ and $D_{11}$ are formed in a p-type well region through impurity ion implantation by using a resist layer as a mask. Thereafter, SOG (spin-on-glass) is coated on the upper surface of the substrate and cured to form an SOG layer which fills the opening of the resist layer. The resist layer and SOG layer left on it are removed, and then ion implanted source and drain regions $S_{12}$ and $D_{12}$ are formed in an n-type well region through impurity ion implantation by using the SOG layer as a mask. The ion implanted source and drain regions $S_{12}$ and $D_{12}$ are formed in a self-alignment manner relative to the ion implanted source and drain regions $S_{11}$ and $D_{11}$. The SOG layer may be formed by etching back a thick SOG layer. A simple method of forming an impurity doped region in a self-alignment manner relative to another impurity doped region.

8 Claims, 12 Drawing Sheets

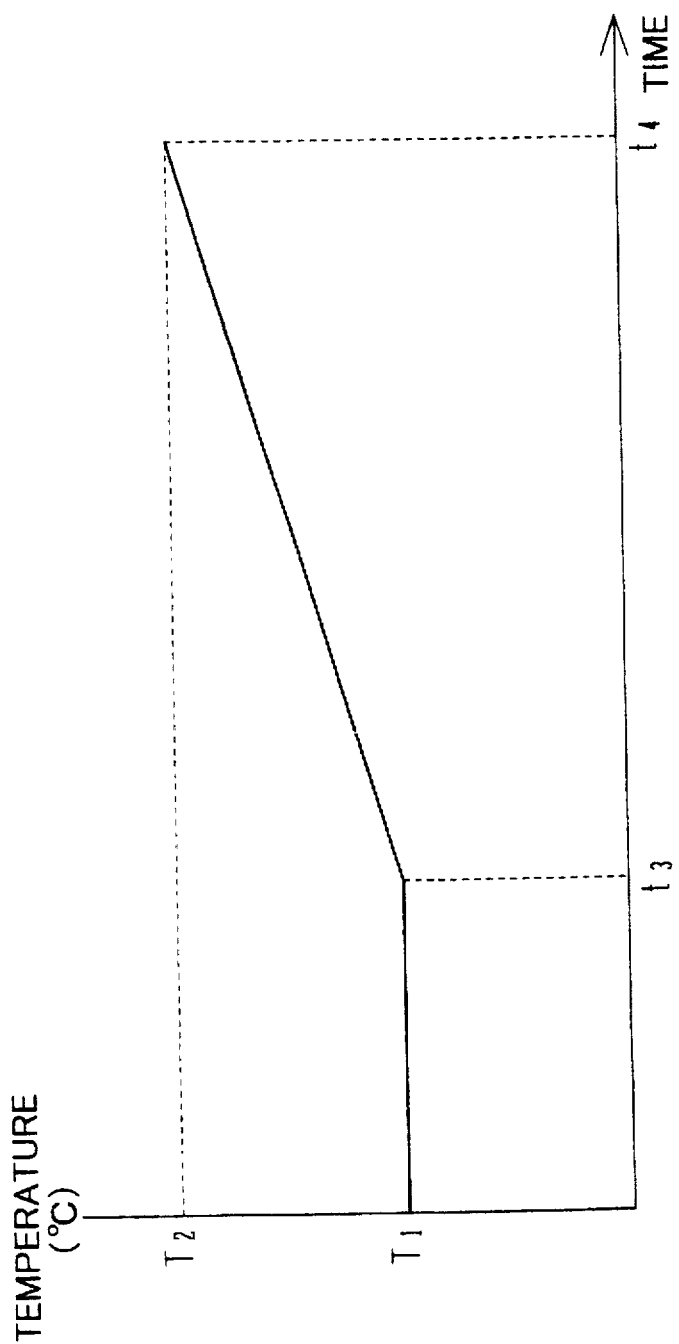

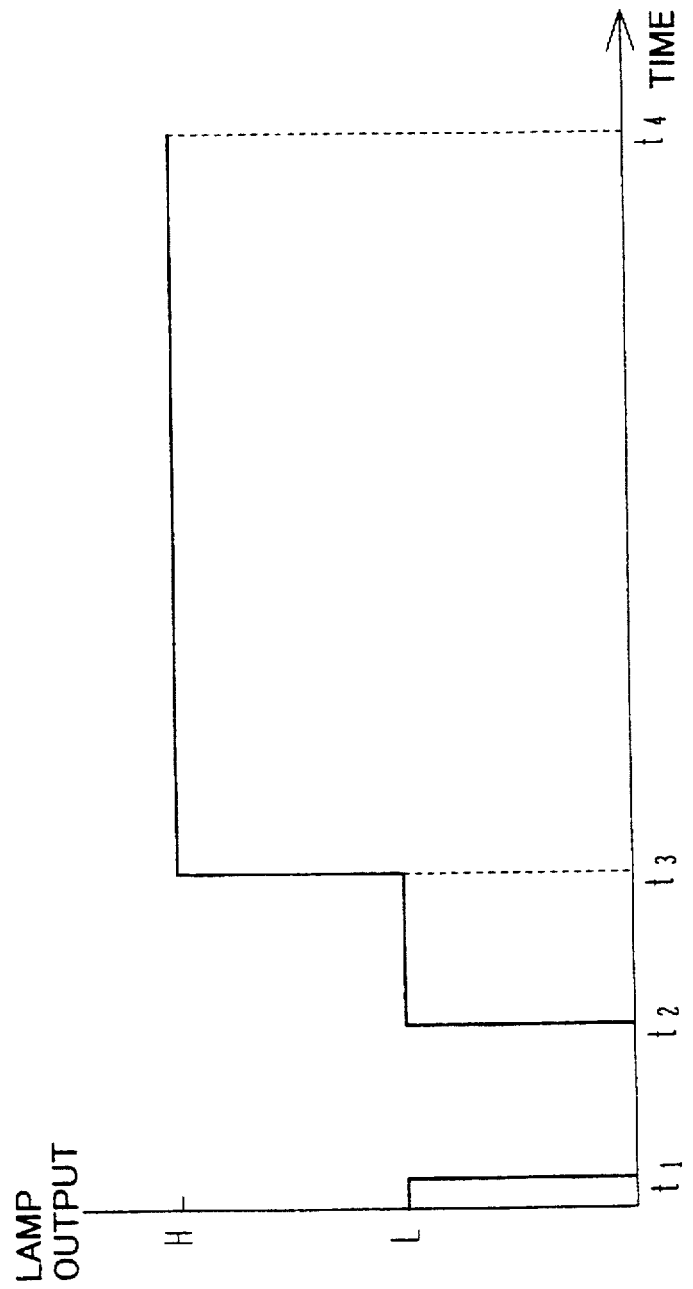

MANUFACTURE OF SEMICONDUCTOR DEVICE WITH SELF-ALIGNED DOPING

This application is based on a Japanese patent application No. 8-71482, filed on Mar. 2, 1996, the entire contents of which are incorporated herein by reference.

BACKGROUND OF THE INVENTION a) Field of the Invention

The present invention relates to manufacture of semiconductor devices, and more particularly to a method of manufacturing a semiconductor device including a process of forming an impurity doped region in a self-alignment manner relative to another impurity doped region.

b) Description of the Related Art

A method of manufacturing a complementary MOS type integrated circuit (CMOS type IC) heretofore proposed is illustrated in FIGS. 14 to 17.

At the process shown in FIG. 14, in the surface layer of an n-type semiconductor substrate 10, a p-type well region 12, an n-type well region 14, a field insulating film 16, and the like are formed. In a moat 16A of the insulating film 16, a gate electrode layer 20a is formed on a gate insulating film 18a, and in another moat 16B of the insulating film 16, a gate electrode layer 20b is formed on a gate insulating film 18b. A resist layer 24 having an opening which exposes the moat 16A is formed on the upper surface of the substrate by well known photolithography. Thereafter, by using the resist layer 24, insulating film 16, and electrode layer 20a as a mask, impurity ions (e.g., $P^+$) are selectively implanted via the insulating film 18a into the surface area of the well region 12 to form impurity doped source and drain regions $S_{11}$ and $D_{11}$ of relatively low concentration.

In the ion implantation process shown in FIG. 14, ions are implanted at an incident angle slanted by a predetermined angle from the normal to the surface of the substrate 10 while the substrate 10 is rotated. After the ion implantation, the resist film 24 is removed by a well known method.

At the process shown in FIG. 15, a resist layer 26 having an opening which exposes the moat 16B is formed. Thereafter, by using the resist layer 26, insulating film 16, and electrode layer 20b as a mask, impurity ions (e.g., $BF_2^+$) are selectively implanted via the insulating film 18b into the surface area of the well region 14 to form impurity doped source and drain regions $S_{12}$ and $D_{12}$ of relatively low concentration.

In this ion implantation process, similar to the process shown in FIG. 14, ions are implanted at an incident angle slanted by a predetermined angle from the normal to the surface of the substrate 10 while the substrate 10 is rotated. Thereafter, the resist film 26 is removed.

At the process shown in FIG. 16, an insulating film such as silicon oxide is deposited on the upper surface of the substrate by chemical vapor deposition (CVD) or the like. The insulating film is then etched back to form side spacers 22a on the side walls of the electrode layer 20a on the source and drain sides and side spacers 22b on the side walls of the electrode layer 20b on the source and drain sides. This etch-back process also etches the insulating films 18a and 18b to leave them only under the electrode layer 20a and side spacers 22a and only under the electrode layer 20b and side spacers 22b. The left insulating films 18a and 18b are used for gate insulating films.

A resist layer 28 having an opening which exposes the moat 16B is formed. Thereafter, by using the resist layer 28, insulating film 16, a lamination of the insulating film 18b and electrode layer 20b and a lamination of the insulating film 18b and side spacers 22b as a mask, impurity ions (e.g., $BF_2^+$) are selectively implanted into the surface area of the well region 14 to form impurity doped source and drain regions $S_{22}$ and $D_{22}$ of relatively high concentration. In this ion implantation process, ions are implanted at an incident angle generally perpendicular to the surface of the substrate 10. Thereafter, the resist layer 28 is removed.

At the process shown in FIG. 17, a resist layer 30 having an opening which exposes the moat 16A is formed. Thereafter, by using the resist layer 30, insulating film 16, a lamination of the insulating film 18a and electrode layer 20a and a lamination of the insulating film 18b and side spacers 22a as a mask, impurity ions (e.g., $P^+$) are selectively implanted into the surface area of the well region 12 to form impurity doped source and drain regions $S_{21}$ and $D_{21}$ of relatively high concentration. In this ion implantation process, ions are implanted at an incident angle generally perpendicular to the surface of the substrate 10. After the resist layer 30 is removed, annealing is performed to activate implanted impurity ions.

Another conventional method of manufacturing a CMOS type IC has been proposed as illustrated in FIGS. 18 and 19. In FIGS. 18 and 19, like elements to those shown in FIGS. 14 to 17 are represented by using identical reference numerals and the detailed description thereof is omitted.

At the process shown in FIG. 18, after a gate insulating film is formed, a gate electrode material layer of polysilicon or polycide (silicide on polysilicon) is deposited on the upper surface of the substrate. The gate electrode material layer and gate insulating film are patterned into a desired gate structure to form gate insulating films 18a and 18b and gate electrode layers 20a and 20b.

Similar to the process shown in FIG. 14, impurity doped regions $S_{11}$ and $D_{11}$ are formed in the well region 12. Similar to the process shown in FIG. 15, impurity doped regions $S_{12}$ and $D_{12}$ are formed in the well region 14.

At the process shown in FIG. 19, side spacers 22a are formed on the side walls of a lamination of the insulating film 18a and electrode layer 20a on the source and drain sides, and side spacers 22b are formed on the side walls of a lamination of the insulating layer 18b and electrode layer 20b on the source and drain sides. Similar to the process shown in FIG. 16, after impurity doped regions $S_{22}$ and $D_{22}$ are formed in the well region 14, similar to the process shown in FIG. 17, impurity doped regions $S_{21}$ and $D_{21}$ are formed in the well region 12. Thereafter, annealing is performed to activate doped impurity ions.

A well forming method such as illustrated in FIGS. 20 to 22 is known (for example, refer to Japanese Patent Laid-open Publication No. 4-343264).

At the process shown in FIG. 20, after a silicon oxide film 32 is formed on the surface of an n-type semiconductor substrate 10, impurity ions (e.g., $P^+$) are selectively implanted via the silicon oxide film 32 into the surface area of the substrate by using a resist pattern 34 as a mask to form an impurity doped region $W_1$. A silicon oxide film 36 is formed only in the opening of the resist layer 34 by liquid phase growth.

At the process shown in FIG. 21, after the resist film 34 is removed, impurity ions (e.g., $B^+$) are selectively implanted via the silicon oxide film 32 into the surface area of the substrate by using the silicon oxide film 36 as a mask to form an impurity doped region $W_2$.

At the process shown in FIG. 22, after the silicon oxide film 36 is removed, annealing is performed to activate doped impurity ions. An n-type well region 38 (1) and a p-type well region 38 (2) are therefore formed in the impurity doped regions $W_1$ and $W_2$, respectively.

The method illustrated in FIGS. 14 to 17 or the method illustrated in FIGS. 18 and 19 requires to execute photolithography processes four times for forming resist masks and implanting impurity ions. There arise problems of mask alignment errors, long manufacture period, high cost, and the like.

The method illustrated in FIGS. 20 to 22 uses a liquid phase growth film 36 as a mask. Therefore, this method has advantages that the impurity doped region $W_2$ can be formed in a self-alignment manner relative to the impurity doped region $W_1$ and that one photolithography process can be omitted.

However, this method illustrated in FIGS. 20 to 22 is associated with the following problem. Supersaturated solution of silicon dioxide used for liquid phase growth contains boric acid ($H_3BO_3$), aluminum trichloride, aluminum, or other elements. Therefore, if the underlying growth layer is a gate electrode, source region, drain region or the like, it is necessary to form a protective film such as silicon oxide film 32 and then remove it. This makes the manufacture process complicated.

SUMMARY OF THE INVENTION

It is an object of the present invention to provide a simple method of forming an impurity doped region in a self-alignment manner relative to another impurity doped region.

According to one aspect of the present invention, there is provided a method of manufacturing a semiconductor device, comprising the steps of: a) providing a substrate having a first region and a second region; b) forming a resist mask covering the first region and having an opening over the second region; c) curing the resist mask; d) implanting first type impurity ions into the second region; e) coating the substrate with a second material so as to fill the opening, the second material including a solvent which is repelled on the resist material; f) removing the resist mask so as to provide an inverse mask of the second material, the inverse mask covering the second region and having an opening over the first region; and g) implanting second type impurity ions, which is opposite to the first type impurity ions, into the first region.

The inverse mask may be formed by etching back a thick layer.

The inverse mask is formed in the opening of the resist mask used for forming the first type impurity doped second region. After the resist mask is removed, the second type impurity doped first region is formed by using the inverse mask. The second type impurity doped first region can be therefore formed in a self-alignment manner relative to the first impurity doped second region.

The inverse mask may be formed by coating and curing fluid glass such as SOG (spin on glass) which contains organic solvent. Even if the surface to be coated is a wiring surface, the surface of source or drain region, or the like, a protective film is not necessary and the manufacture process can be simplified.

As above, an impurity doped region can be formed in a self-alignment manner relative to another impurity doped region. It is therefore possible to improve a manufacture yield, shorten a manufacture period, and lower a manufacture cost.

BRIEF DESCRIPTION OF THE DRAWINGS

FIGS. 1 to 10 are cross sectional views of a substrate illustrating main processes of a CMOS IC manufacture method according to an embodiment of the invention: wherein FIG. 1 illustrates a resist layer forming step and an ion implanting step;

FIG. 2 illustrates an SOG coating step after the steps of FIG. 1;

FIG. 3 illustrates a resist removing step after the step of FIG. 2;

FIG. 4 illustrates an ion implanting step after the step of FIG. 3;

FIG. 5 illustrates an SOG removing step and a side spacer forming step after the step of FIG. 4;

FIG. 6 illustrates a resist layer forming step and an ion implanting step after the steps of FIG. 5;

FIG. 7 illustrates an SOG coating step after the steps of FIG. 6;

FIG. 8 illustrates a resist removing step after the step of FIG. 7;

FIG. 9 illustrates an ion implanting step after the step of FIG. 8; and

FIG. 10 illustrates an SOG removing step and an impurity activating step after the step of FIG. 9.

FIGS. 11A and 11B are graphs explaining a process of irradiating far ultraviolet rays to a resist layer.

FIG. 12 illustrates an SOG coating step; and

FIG. 13 illustrates an etch-back step after the step of FIG. 12.

DETAILED DESCRIPTION OF THE PREFERRED EMBODIMENTS

Figure 1:
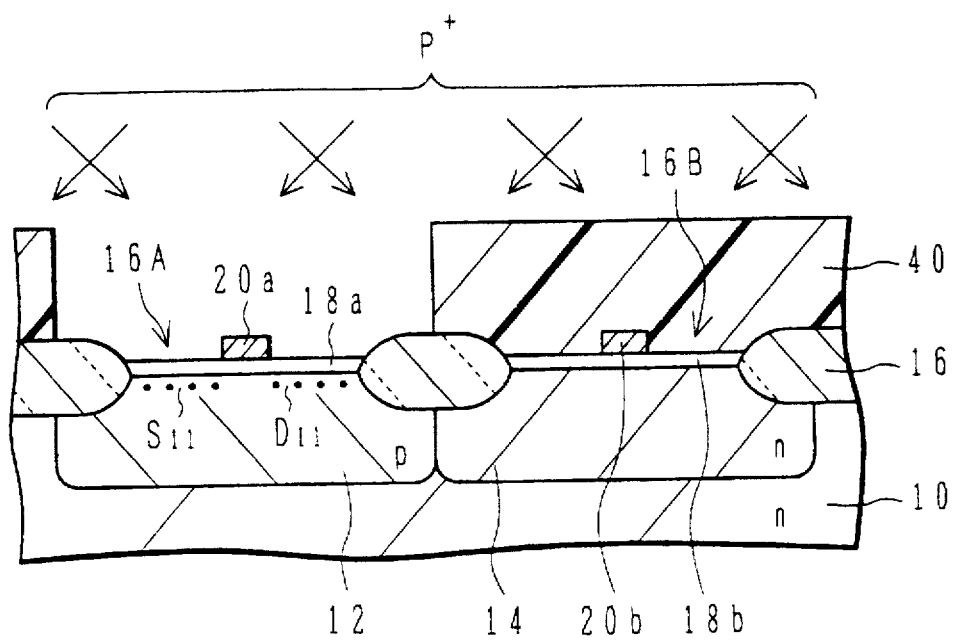

FIGS. 1 to 10 illustrate a CMOS IC manufacture method according to an embodiment of the invention. Processes (1) to (10) corresponding to FIGS. 1 to 10 will be described in this order.

(1) On the surface of an n-type semiconductor substrate 10 made of, for example, silicon, a p-type well region 12 and an n-type well region 14 are formed by a well known method. Thereafter, a field insulating film 18 of silicon oxide is formed by well known selective oxidation. The insulating film 16 has moats 16A and 16B corresponding to the well regions 12 and 14.

The silicon surface in the moats 16A and 16B of the insulating film 16 is thermally oxidized to form gate insulating films 18a and 18b of silicon oxide. Thereafter, a gate electrode material layer of polysilicon, polycide, or the like is deposited on the upper surface of the substrate, and patterned into a desired gate electrode structure to form gate electrode layers 20a and 20b on the gate insulating films 18a and 18b.

A resist film 40 having an opening which exposes the moat 16A and also covers the moat 16B is formed on the upper surface of the substrate by photolithography. For example, this resist layer is formed of a novolac type positive resist and has a thickness of about 1.3 μm. It is preferable to cure the patterned resist layer 40 by irradiating far ultraviolet rays thereto. For example, far ultraviolet rays having a main wavelength of 220-320 nm are irradiated from mercury lamp. As far ultraviolet rays are applied to the resist layer 40, curing is accelerated. Further, the resist material is ionized. For example, novolac positive resist is ionized so as to have

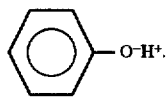

Therefore, resistance to solvent of the resist layer 40 is improved and the nature of resist material is altered to be hydrophilic and easy to repel SOG including solvent to be later coated thereon (wettability of the resist surface is lowered).

FIGS. 11A and 11B show an example of far ultraviolet ray irradiation. The abscissa represents time and the ordinate represents a temperature (FIG. 11A) of a resist layer and an output level (FIG. 11B) of a lamp. The lamp output is set to zero, high (H), and low (L).

Figure 14:
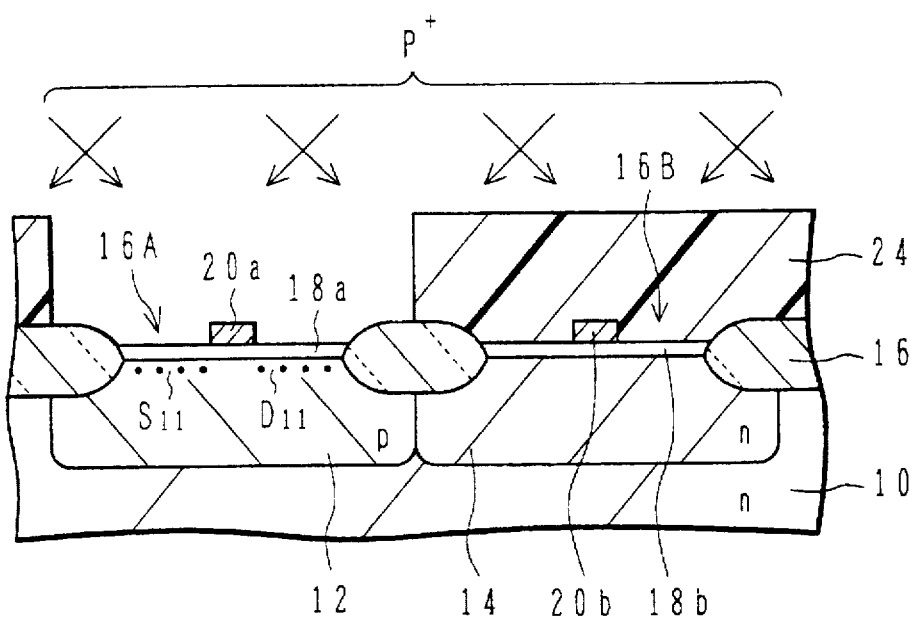
FIGS. 14 to 17 are cross sectional views of a substrate illustrating main processes of a conventional CMOS IC manufacture method.
Figure 15:
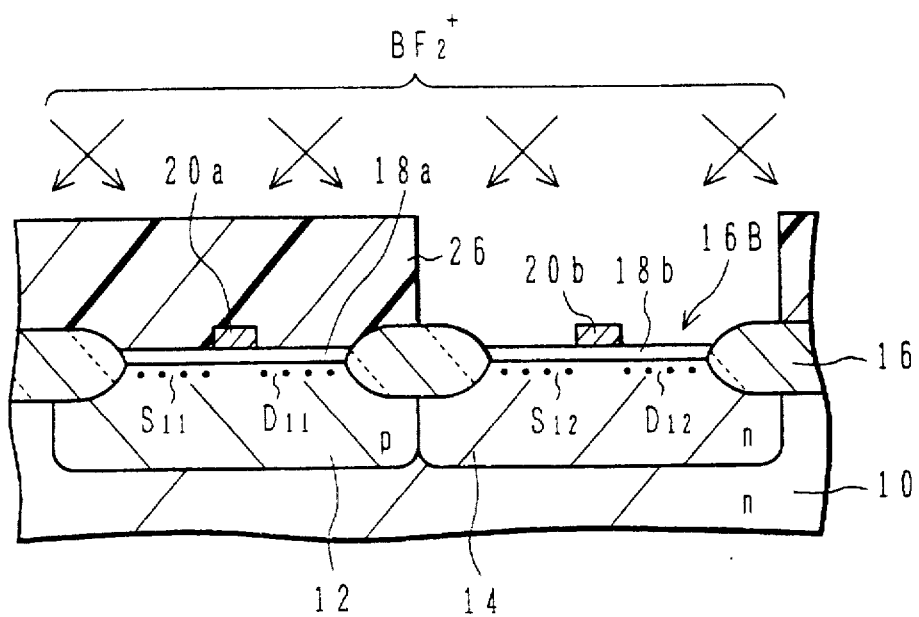
Figure 16:
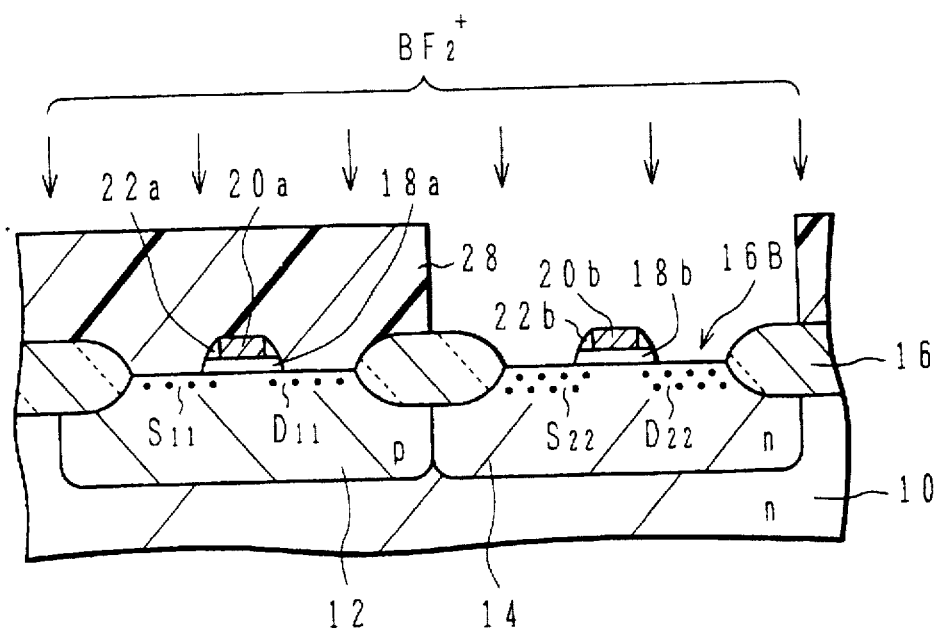
Figure 17:
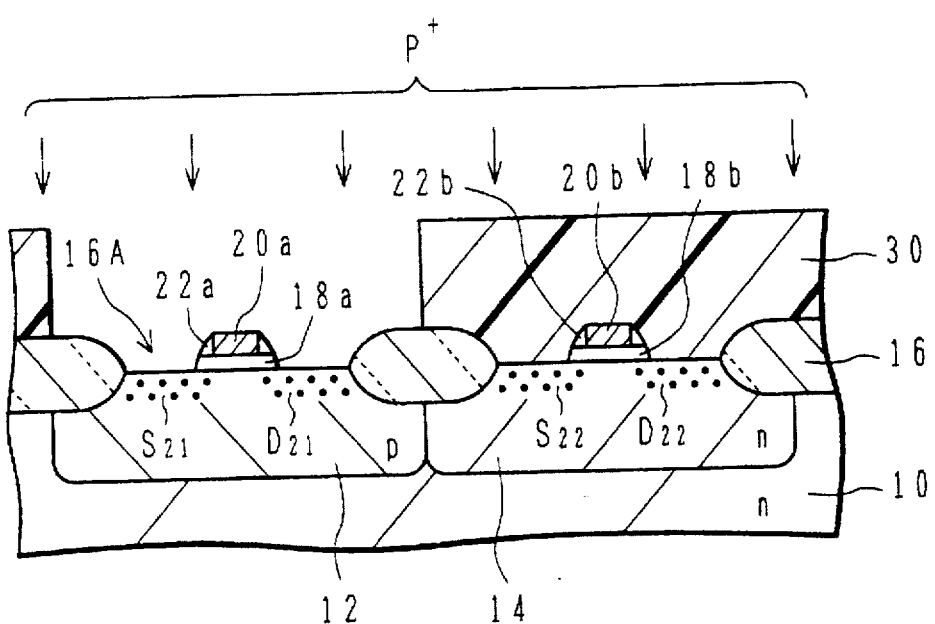

Next, by using the resist layer 40, insulating film 16, and electrode layer 20a as a mask, impurity ions (e.g., $P^+$) are selectively implanted via the insulating film 18a into the surface area of the well region 12 to form impurity doped n-type source and drain regions $S_{11}$ and $D_{11}$ of relatively low concentration. In this case, similar to the case described with FIG. 14, ions are implanted at an incident angle slanted by a predetermined angle from the normal to the surface of the substrate 10 while the substrate 10 is rotated.

Figure 2:
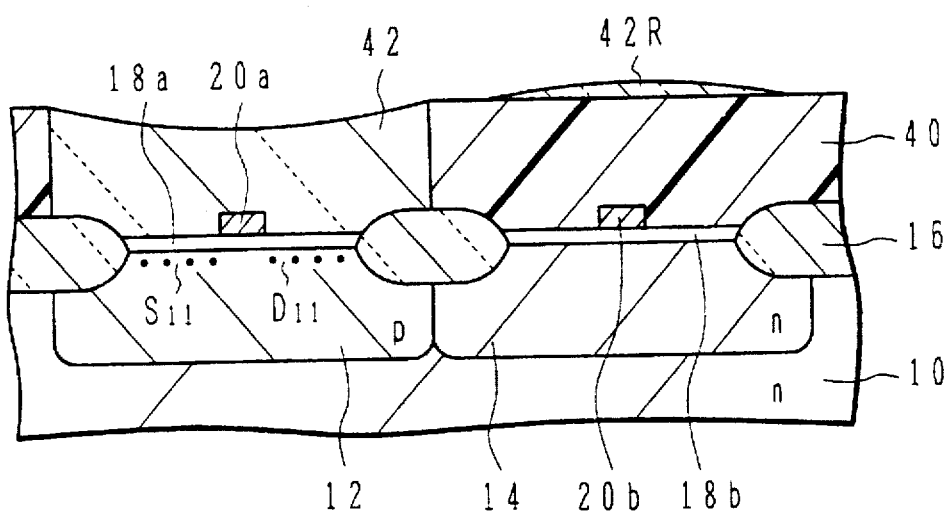

(2) SOG (spin-on-glass) material is coated by well known spin coating on the upper surface of the substrate having the resist layer 40 mask, and cured to form an SOG layer 42 filling the opening of the resist layer 40. SOG may be the following SOG developed in solvent such as alcohol and ketone:

a) organic SOG: $RnSi(OH)_{4-n}$, where R is one of $CH_3$, $C_6H_5$, and $C_2H_5$, or b) inorganic SOG: $Si(OH)_4$ Instead of SOG, hydrogen silsesquioxane and resin $(HSiO_{3/2})_n$ developed in alcohol, ketone, or the like may be used. Since the resist layer was cured through irradiation of far ultraviolet rays, the resist layer 40 even in contact with SOG solvent, alcohol, maintains its original shape and will not deform or be dissolved. Alchohol is less ionized than resist material, even if ionized —OH base is ionized as —$O^+H^-$ so that, it is repelled on the resist material cured with ultraviolet rays. As a result, SOG on the resist layer 40 is repelled and is not coated well on the resist layer 40. As a result, as shown in FIG. 2, SOG is mainly left as the SOG layer in the opening of the resist layer 40 and a fraction of an SOG layer 42R is left on the resist layer 40.

The resist layer 40 has a low heat resistance. Therefore, if cure baking is performed after SOG is coated, it is important not to bake at a high temperature (e.g., 200° C. or higher). For example, baking is performed at a temperature lower than 200° C.

(3) The resist layer 40 is removed by $O_3$ ashing through photo excitation, $H_2SO_4/H_2O_2$ washing, or the like. At this time, the SOG layer 42R on the resist layer 40 is removed (lift-off). As a result, an inverse mask made of SOG layer 42 which covers the moat 16A and also exposes the moat 16B is formed.

(4) By using as a mask the SOG layer 42 self-aligned by the resist layer 40, the insulating film 16, and the electrode layer 20b, impurity ions (e.g., $BF_2^+$) are selectively implanted via the insulating film 18b into the surface area of the well region 14 to form impurity doped p-type source and drain regions $S_{12}$ and $D_{12}$ of relatively low concentration. In this case, similar to the case described with FIG. 1, ions are implanted at an incident angle slanted by a predetermined angle from the normal to the surface of the substrate 10 while the substrate 10 is rotated.

In the above processes, impurity ions for an n-channel MOSFET are implanted by using the resist layer 40 as a mask and impurity ions for a p-channel MOSFET are implanted by using the SOG layer as a mask. Instead, ions for a p-channel MOSFET may be implanted by using a resist mask and ions for an n-channel MOSFET may be implanted by using an SOG layer as a mask. Obviously, ion species may be changed.

(5) The SOG film 42 is removed by dilute hydrofluoric acid. An insulating film such as silicon oxide is deposited on the upper surface of the substrate by CVD or the like. This insulating film is then etched back to form side spacers 22a on the side walls of the electrode layer 20a on the source and drain sides and side spacers 22b on the side walls of the electrode layer 20b on the source and drain sides. This etch-back process also etches the insulating films 18a and 18b to leave them only under the electrode layer 20a and its side spacers 22a and only under the electrode layer 20b and its side spacers 22b.

(6) A resist layer 44 having an opening which exposes the moat 16A is formed by photolithography. It is preferable to cure the resist layer 44 through irradiation of far ultraviolet rays, similar to the case described with FIG. 1.

Next, by using the resist layer 44, insulating film 16, a lamination of the insulating film 18a and electrode layer 20a and a lamination of the insulating film 18a and side spacers 22a as a mask, impurity ions (e.g., $P^+$) are selectively implanted into the surface area of the well region 12 to form impurity doped n-type source and drain regions $S_{21}$ and $D_{21}$ of relatively high concentration. In this ion implantation process, ions are implanted at an incident angle generally perpendicular to the surface of the substrate 10.

(7) Similar to the process described with FIG. 2, an SOG layer 46 is formed filling the opening of the resist layer 44.

Figure 3:
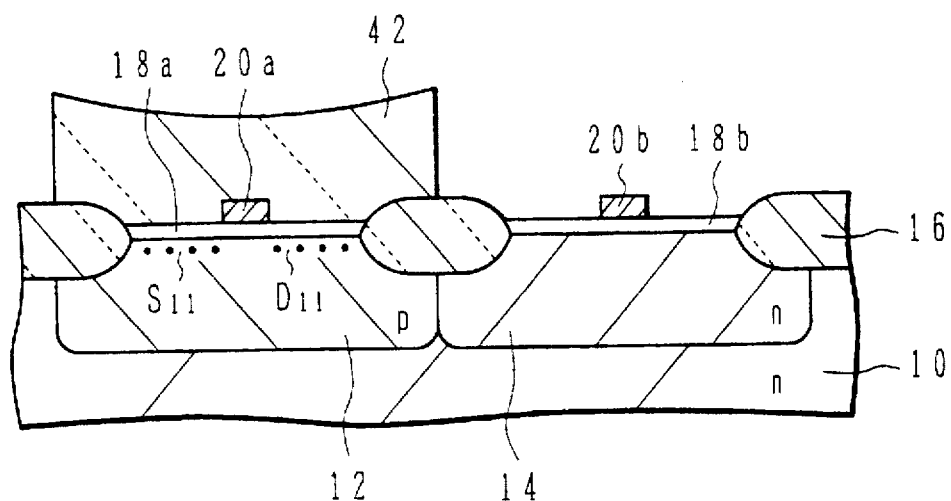
Figure 4:
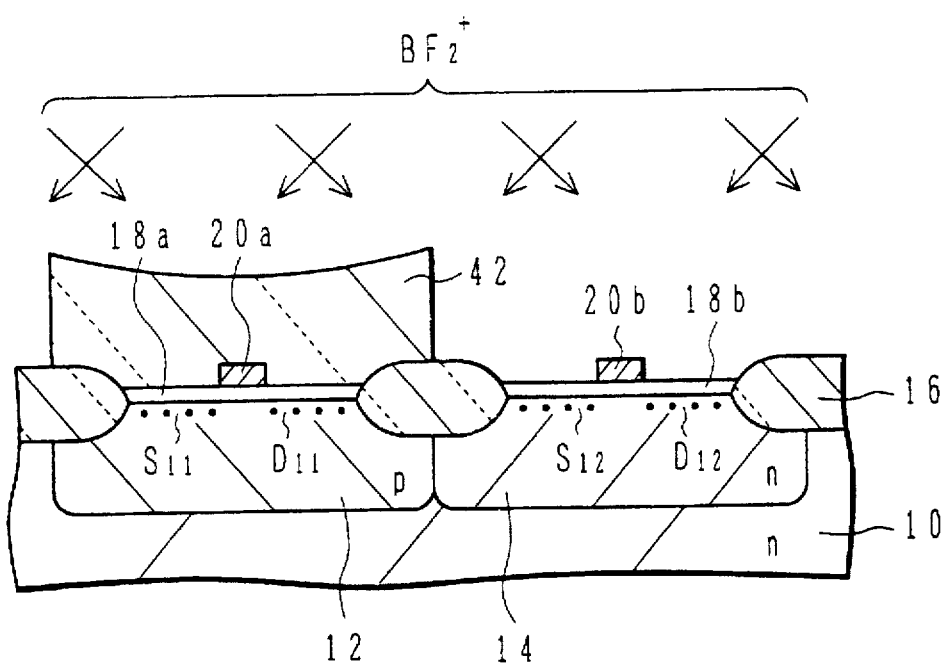

(8) Similar to the process described with FIG. 3, the resist layer 44 and the resist layer 46R left on the former layer are removed. Similar to the process depicted in FIG. 3, an inverse mask is formed.

(9) By using the SOG layer 46, insulating film 16, a lamination of the insulating film 18b and electrode layer 20b and a lamination of the insulating film 18b and side spacers 22b as a mask, impurity ions (e.g., $BF_2^+$) are selectively implanted into the surface area of the well region 14 to form impurity doped p-type source and drain regions $S_{22}$ and $D_{22}$ of relatively high concentration. In this ion implantation process, ions are implanted at an incident angle generally perpendicular to the surface of the substrate 10.

Figure 5:
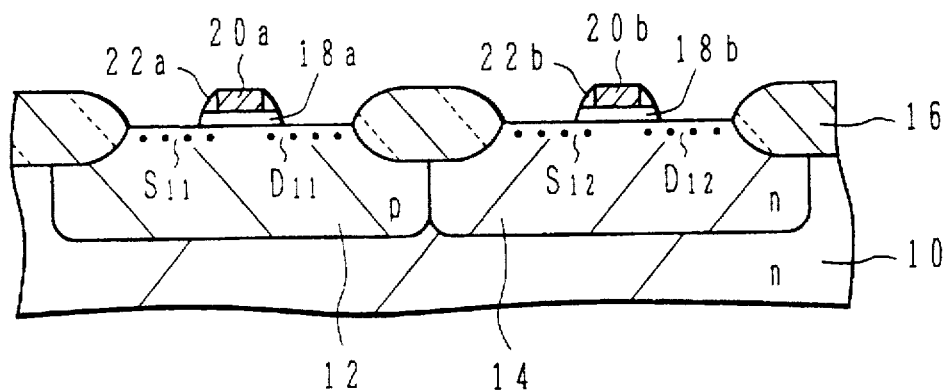
Figure 6:
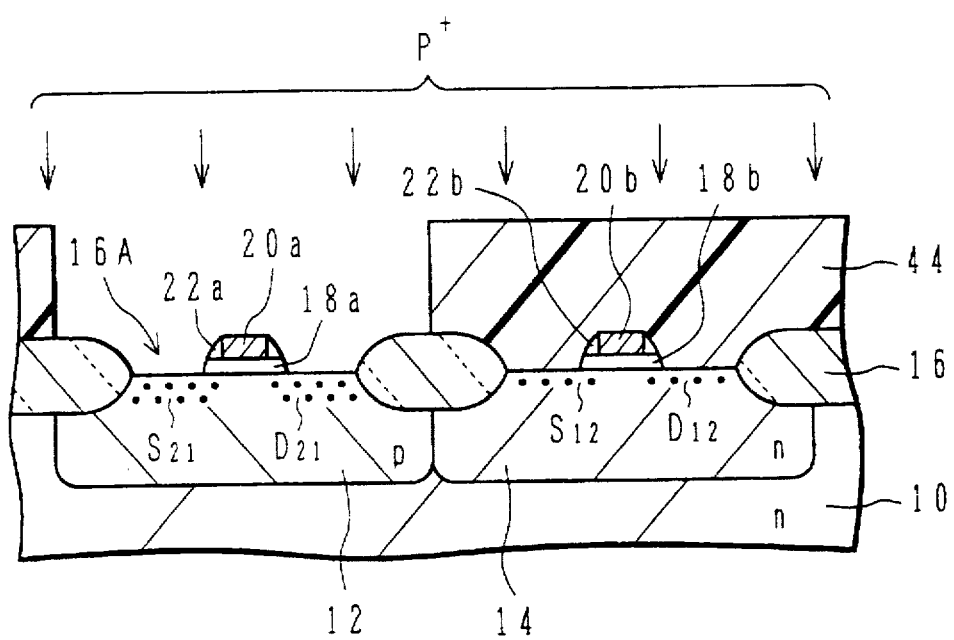

(10) Similar to the process described with FIG. 5, the SOG layer 46 is removed. Annealing is performed to activate implanted impurity ions. Formed therefore are n⁻type source and drain regions 50 and 52 corresponding to the impurity doped regions $S_{11}$ and $D_{11}$, p⁻type source and drain regions 54 and 56 corresponding to the impurity doped regions $S_{12}$ and $D_{12}$, n⁺type source and drain regions 58 and 60 corresponding to the impurity doped regions $S_{21}$ and $D_{21}$, and p⁺type source and drain regions 62 and 64 corresponding to the impurity doped regions $S_{22}$ and $D_{22}$.

In the above embodiment, SOG is coated thinner than the depth of the opening of the resist layer to form the SOG layer as an impurity mask. Alternatively, as shown in FIGS. 12 and 13, SOG may be coated thicker than the depth of the resist layer opening and etched back to form an SOG layer as an impurity mask.

Figure 12:
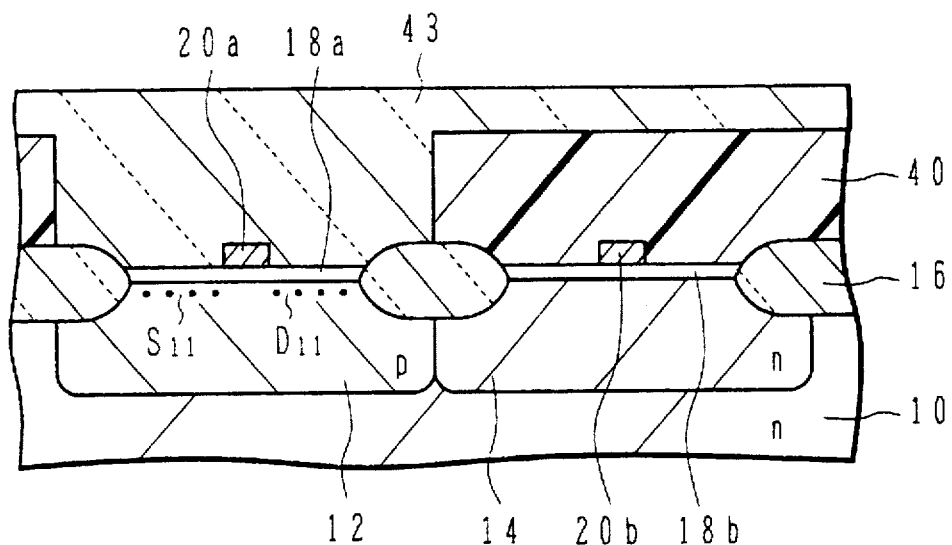
FIGS. 12 and 13 are cross sectional views of a substrate illustrating main processes of a CMOS IC manufacture method according to another embodiment of the invention.

Specifically, at the process shown in FIG. 12, following the process described with FIG. 1, SOG is spin coated and cured to form an SOG layer covering the resist layer 40 and filling the opening. In this case, in the process of FIG. 1, curing through irradiation of far ultraviolet rays may be omitted.

Next, at the process shown in FIG. 12, the SOG layer 43 is etched back until the upper surface of the resist layer 40 is exposed, and a portion of the SOG layer 43 is left unetched so as to fill the opening of the resist layer 40. Thereafter, the process of FIG. 3 is performed to use the SOG layer 45 as an impurity mask similar to the SOG layer 42.

Figure 7:
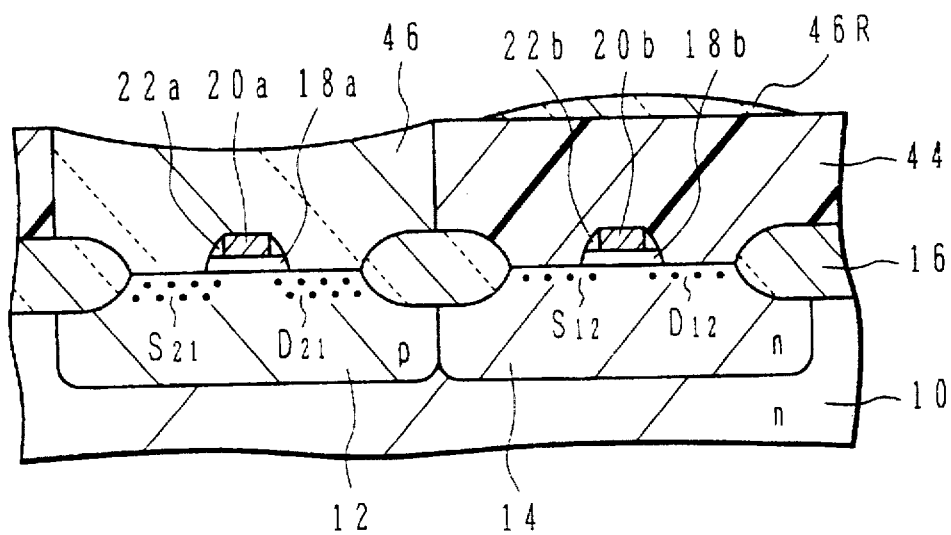
Figure 8:
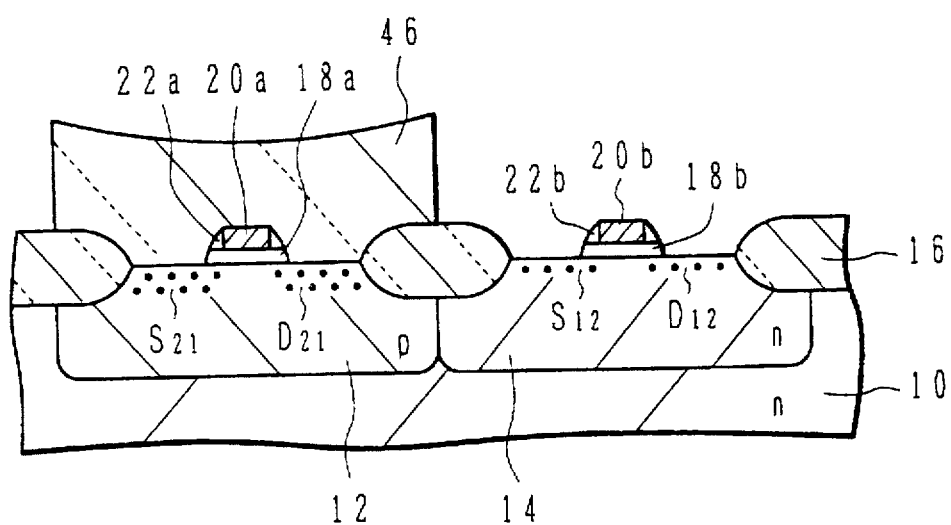
Figure 9:
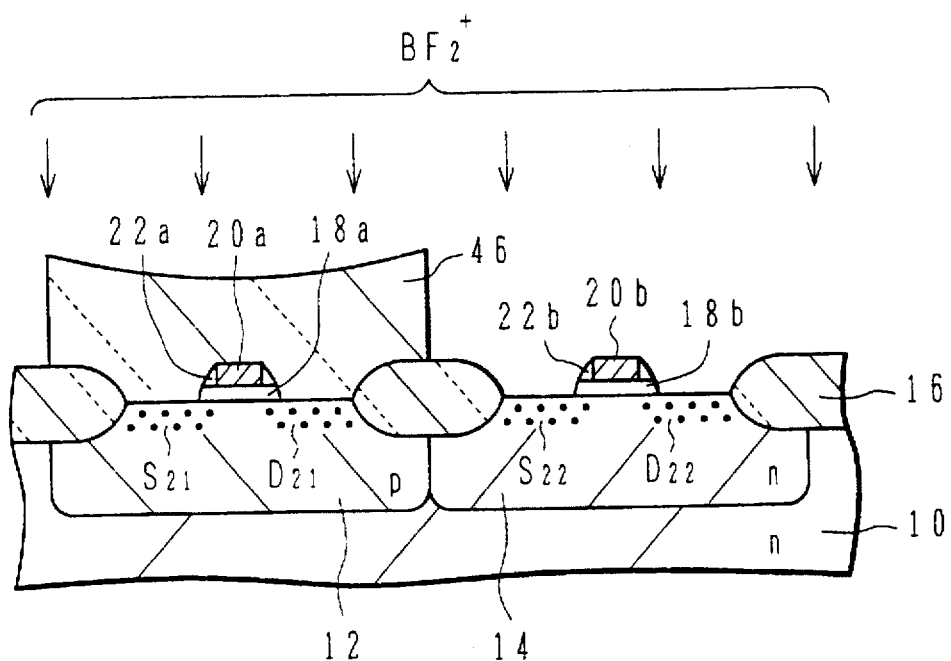
Figure 10:
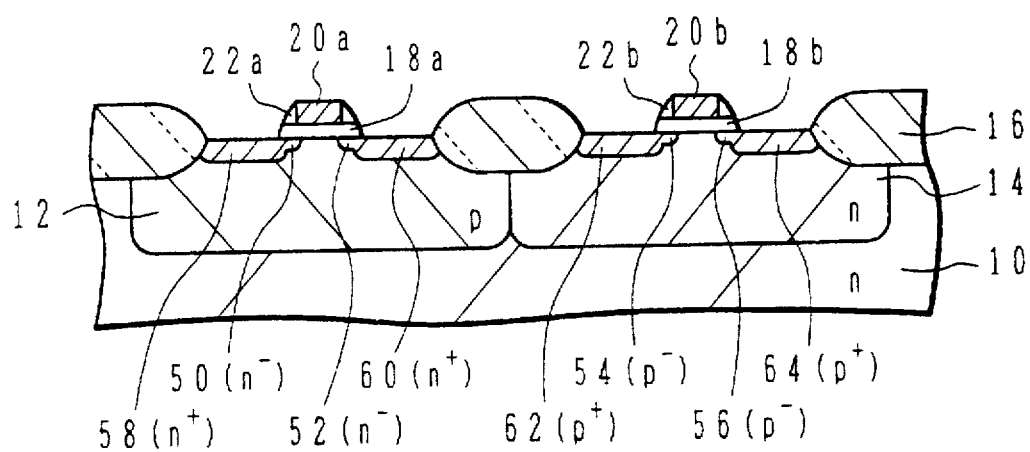
Figure 13:
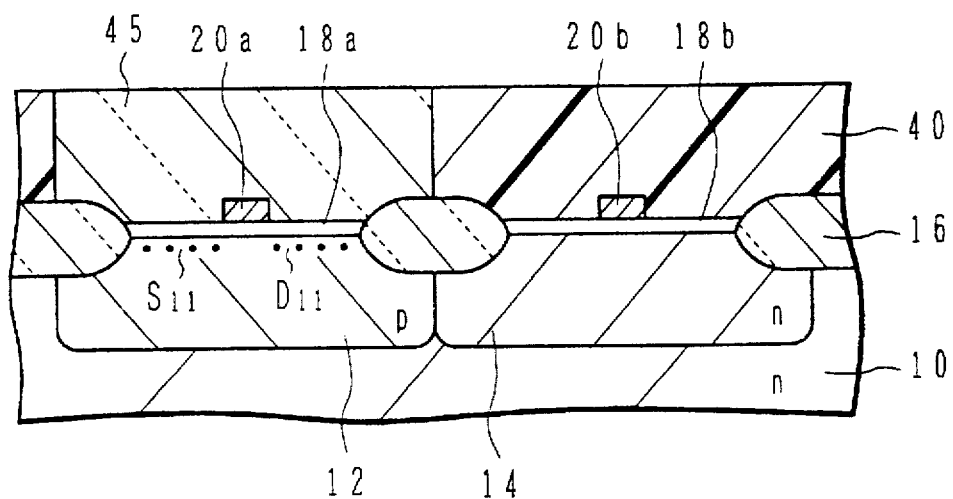

The processes shown in FIGS. 12 and 13 may be utilized in place of the process of FIG. 7. An SOG layer similar to the SOG layer 45 is used in place of the SOG layer 46.

In the above embodiments, the impurity doped regions $S_{12}$ and $D_{12}$ are formed in a self-alignment manner relative to the impurity doped regions $S_{11}$ and $D_{11}$, and the impurity doped regions $S_{22}$ and $D_{22}$ are formed in a self-alignment manner relative to the impurity doped regions $S_{21}$ and $D_{21}$. Two photolithography processes can be reduced as opposed to four processes of the conventional method illustrated in FIGS. 14 to 19. Furthermore, a protective layer is not necessary to be formed under the SOG layers 42, 45, and 46 so that the process can be simplified. It is therefore possible to manufacture a CMOS IC having a lightly doped drain (LDD) structure, with high yield, in short manufacture period, and at low cost.

The invention is not limited to only the above embodiment, but various modifications are possible. For example, the following modifications are possible.

Figure 18:
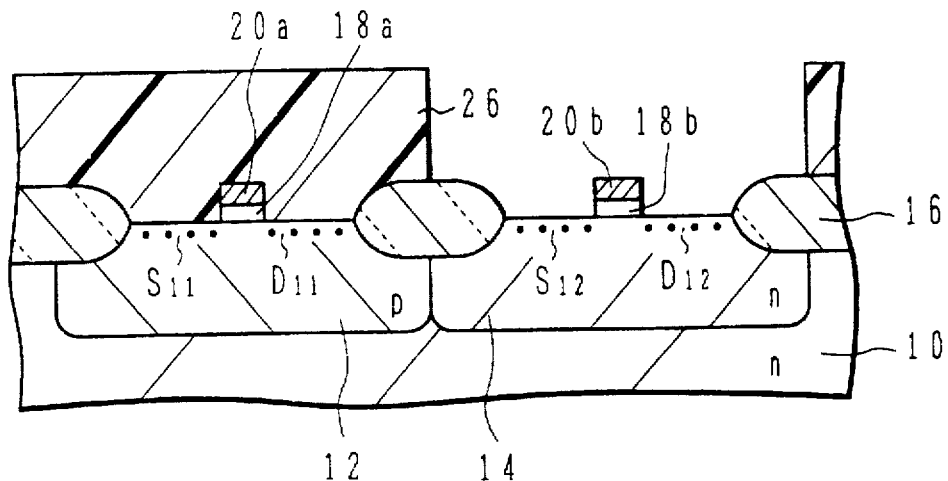
FIGS. 18 and 19 are cross sectional views of a substrate illustrating main processes of another conventional CMOS IC manufacture method.
Figure 19:
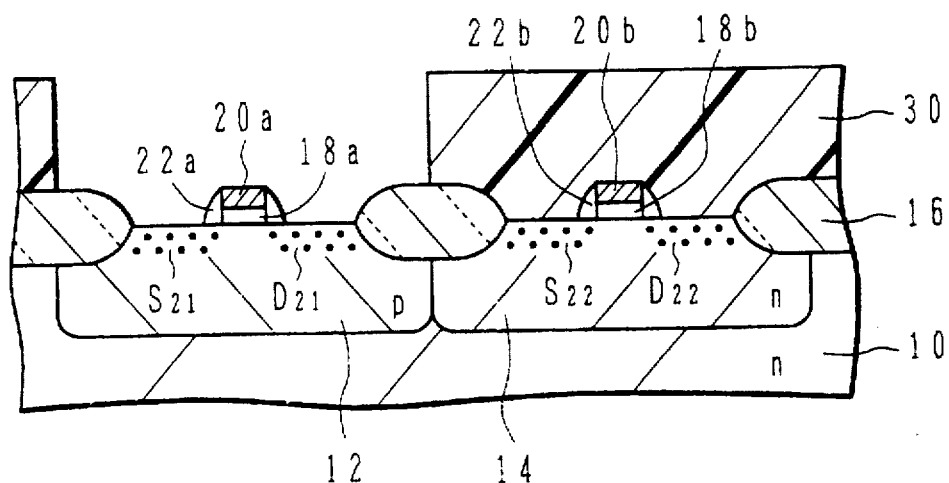

(1) The embodiments shown in FIGS. 1 to 10 and FIGS. 12 and 13 of this invention are applicable to the CMOS IC manufacture method shown in FIGS. 18 and 19.

Figure 20:
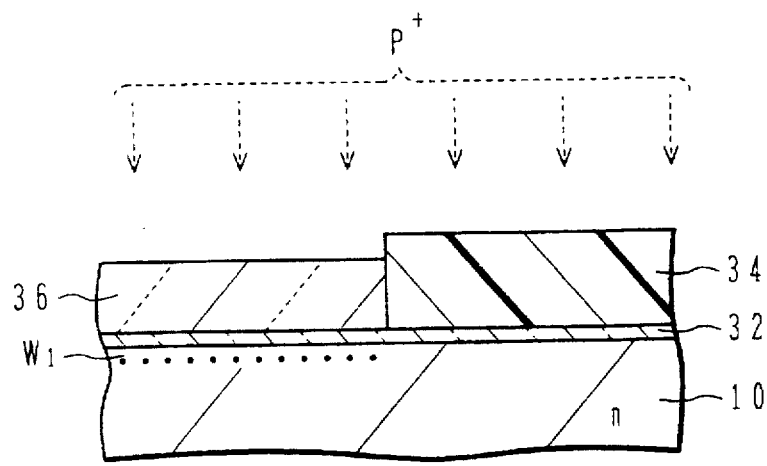
FIGS. 20 to 22 are cross sectional views of a substrate illustrating an example of a conventional well forming method.
Figure 21:
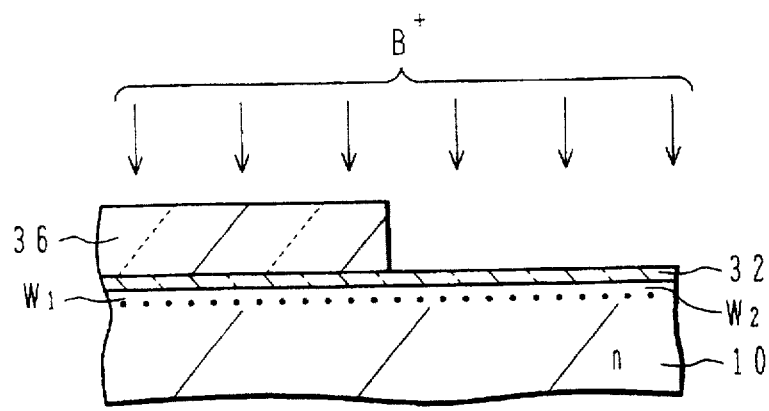
Figure 22:
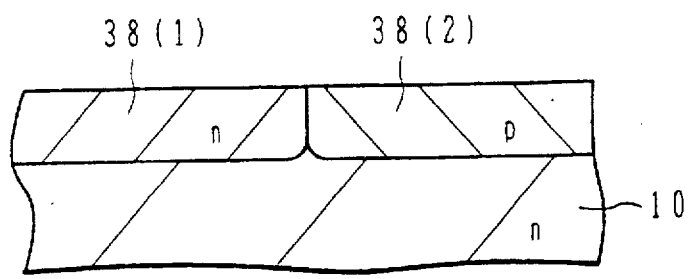

(2) The embodiments of this invention is also applicable to the well forming method shown in FIGS. 20 to 22, and to ion implantation into n- and p-type well regions for threshold voltage control.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device, comprising the steps of:

a) providing a substrate having a first region and a second region;

b) forming a resist mask covering the first region and having an opening over the second region;

c) curing the resist mask;

d) implanting first type impurity ions into the second region;

e) coating the substrate with a second material so as to fill the opening, the second material including a solvent which is repelled on the resist material;

f) removing the resist mask so as to provide an inverse mask of the second material, the inverse mask covering the second region and having an opening over the first region; and g) implanting second type impurity ions, which is opposite to the first type impurity ions, into the first region.

2. A method according to claim 1, further comprising the steps of:

h) removing the inverse mask;

i) providing an insulating layer over the substrate; and j) anisotropically etching the insulating layer.

3. A method according to claim 1, wherein the step c) comprises irradiating ultraviolet ray to the resist mask.

4. A method according to claim 2, wherein the first and second regions are provided with gate electrode structures.

5. A method according to claim 1, wherein the second material consists essentially of the solvent and a material selected from a group consisting of $R_nSi(OH)_{4-n}$, $Si(OH)_4$ and $(HSiO_{3/2})_n$, wherein R is selected from a group consisting of —$CH_3$, —$C_6H_5$ and —$C_2H_5$.

6. A method according to claim 5, wherein the solvent comprises a material selected from a group consisting of alcohol and ketone.

7. A method according to claim 1, further comprising the step of:

e-1) following the step e), baking the second material at a temperature lower than 200° C.

8. A method according to claim 1, further comprising the step of repeating the steps b) to g).

* * * * *